United States Patent
Liu et al.

(10) Patent No.: US 10,558,124 B2
(45) Date of Patent: *Feb. 11, 2020

(54) DISCRETE SOURCE MASK OPTIMIZATION

(71) Applicant: ASML Netherlands B.V., Veldhoven (NL)

(72) Inventors: Xiaofeng Liu, Campbell, CA (US); Rafael C. Howell, Santa Clara, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/257,423

(22) Filed: Jan. 25, 2019

(65) Prior Publication Data
US 2019/0155165 A1    May 23, 2019

Related U.S. Application Data

(63) Continuation of application No. 14/766,703, filed as application No. PCT/EP2014/052110 on Feb. 4, 2014, now Pat. No. 10,191,384.

(Continued)

(51) Int. Cl.
*G03F 7/20* (2006.01)

(52) U.S. Cl.
CPC ........ *G03F 7/70125* (2013.01); *G03F 7/2008* (2013.01); *G03F 7/705* (2013.01); *G03F 7/70116* (2013.01); *G03F 7/70508* (2013.01)

(58) Field of Classification Search
None
See application file for complete search history.

(56) References Cited

U.S. PATENT DOCUMENTS 5,229,872 A    7/1993  Mumola
5,296,891 A    3/1994  Vogt et al.
(Continued)

FOREIGN PATENT DOCUMENTS

JP    2011507292    3/2011
JP    2012069945    4/2012
(Continued)

OTHER PUBLICATIONS

International Search Report dated Jun. 10, 2014 in corresponding International Patent Application No. PCT/EP2014/052110.

(Continued)

*Primary Examiner* — Michelle M Iacoletti
(74) *Attorney, Agent, or Firm* — Pillsbury Winthrop Shaw Pittman LLP

(57) ABSTRACT

A method for improving a lithographic process for imaging a portion of a design layout onto a substrate using a lithographic projection apparatus, the method including: calculating a discrete pupil profile based on a desired pupil profile; selecting a discrete change to the discrete pupil profile; and applying the selected discrete change to the discrete pupil profile. The methods according to various embodiments disclosed herein may reduce the computational cost of discrete optimization from $O(a^n)$ to $O(n)$ wherein a is constant and n is the number of knobs that can generate discrete change in the pupil profile.

20 Claims, 17 Drawing Sheets

Related U.S. Application Data

(60) Provisional application No. 61/769,015, filed on Feb. 25, 2013.

(56) References Cited

U.S. PATENT DOCUMENTS

| | | | |
|---|---|---|---|
| 5,523,193 | A | 6/1996 | Nelson |
| 5,969,441 | A | 10/1999 | Loopstra et al. |
| 6,563,566 | B2* | 5/2003 | Rosenbluth .............. G03F 1/32 250/492.2 |
| 7,003,758 | B2 | 2/2006 | Ye et al. |
| 7,587,704 | B2 | 9/2009 | Ye et al. |
| 8,200,468 | B2 | 6/2012 | Ye et al. |
| 8,264,671 | B2 | 9/2012 | Aarts et al. |
| 8,786,824 | B2 | 7/2014 | Hansen |
| 8,893,060 | B2 | 11/2014 | Feng et al. |
| 9,110,382 | B2 | 8/2015 | Chen |
| 10,191,384 | B2* | 1/2019 | Liu .................... G03F 7/70116 |
| 2009/0323037 | A1 | 12/2009 | Aarts et al. |
| 2010/0265482 | A1 | 10/2010 | Schubert et al. |
| 2010/0315614 | A1 | 12/2010 | Hansen |
| 2011/0116067 | A1 | 5/2011 | Ye |
| 2012/0075605 | A1 | 3/2012 | Chen |
| 2012/0117522 | A1 | 5/2012 | Feng et al. |
| 2012/0133915 | A1 | 5/2012 | Matsuyama et al. |

FOREIGN PATENT DOCUMENTS

| | | |
|---|---|---|
| JP | 2012104823 | 5/2012 |
| TW | 200510917 | 3/2005 |
| TW | 201019041 | 5/2010 |
| WO | 2010/059954 | 5/2010 |
| WO | 2011102109 | 8/2011 |

OTHER PUBLICATIONS

C. Spence, "Full-Chip Lithography Simulation and Design Analysis—How OPC is changing IC Design," Proc. of SPIE, vol. 5751, pp. 1-14 (2005).

Yu Cao et al., "Optimized Hardware and Software for Fast, Full Chip Simulation," Proc. of SPIE, vol. 5754, pp. 407-414 (2005).

Alan E. Rosenbluth et al., "Optimum mask and source patterns to print a given shape," J. Microlith., Microfab., Microsyst., vol. 1, No. 1, pp. 13-30 (Apr. 2002).

Yuri Granik, "Source optimization for image fidelity and throughput," J. Microlith., Microfab., Microsyst., vol. 3, No. 4, pp. 509-522 (Oct. 2004).

Robert Socha et al., "Simultaneous Source Mask Optimization (SMO)," Proc. of SPIE, vol. 5853, pp. 180-193 (2005).

Melchior Mulder et al., "Performance of a Programmable Illuminator for generation of Freeform Sources on high NA immersion systems," Proc. of SPIE, vol. 7520, pp. 75200Y-1-75200Y-9 (2009).

Taiwan Office Action dated May 26, 2016 in corresponding Taiwan Patent Application No. 103105512.

Japanese Office Action dated Jul. 29, 2016 in corresponding Japanese Patent Application No. 2015-558390.

* cited by examiner

1000A

1000B

1000C

DISCRETE SOURCE MASK OPTIMIZATION

This application is a continuation of U.S. patent application Ser. No. 14/766,703, which was filed on Aug. 7, 2015, which is the U.S. national phase entry of PCT patent application no. PCT/EP2014/052110, which was filed on Feb. 4, 2014, which claims the benefit of priority of U.S. provisional patent application No. 61/769,015, which was filed on Feb. 25, 2013. Each of the foregoing applications is incorporated herein in its entirety by reference.

TECHNICAL FIELD

The description herein relates to lithographic apparatuses and processes, and more particularly to a tool to optimize an illumination source and/or patterning device/design layout for use in a lithographic apparatus or process.

BACKGROUND

A lithographic projection apparatus can be used, for example, in the manufacture of integrated circuits (ICs). In such a case, a patterning device (e.g., a mask) may contain or provide a circuit pattern corresponding to at least a part of an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-ki lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

BRIEF SUMMARY

As an example, OPC addresses the fact that the final size and placement of an image of the design layout projected on the substrate will not be identical to, or simply depend only on the size and placement of the design layout on the patterning device. It is noted that the terms "mask", "reticle", "patterning device" are utilized interchangeably herein. Furthermore, masks and reticles can be broadly termed "patterning devices." Also, person skilled in the art will recognize that, especially in the context of lithography simulation/optimization, the term "mask"/"patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an "exact science", but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured.

Both OPC and full-chip RET verification may be based on numerical modeling systems and methods as described, for example in, U.S. Patent Application Publication No. 2005/0076322 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as γ in Granik's method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic projection apparatus, for example, parameters a user of the lithographic projection apparatus can adjust. It should be appreciated that any characteristics of a lithographic projection process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2× nm node.

A source and patterning device optimization method and system that allows for simultaneous optimization of the source and patterning device using a cost function without constraints and within a practicable amount of time is described in PCT Patent Application No. PCT/US2009/065359, filed on Nov. 20, 2009, and published as PCT Patent Application Publication No. WO 2010/059954, titled "Fast Freeform Source and Mask Co-Optimization Method", which is hereby incorporated by reference in its entirety.

Another source and mask optimization method and system that involves optimizing the source by adjusting pixels of the source is described in U.S. patent application Ser. No. 12/813,456, filed on Jun. 10, 2010, and published as U.S. Patent Application Publication No. 2010/0315614, titled "Source-Mask Optimization in Lithographic Apparatus", which is hereby incorporated by reference in its entirety.

Described herein is a computer-implemented method for improving a lithographic process for imaging a portion of a design layout onto a substrate using a lithographic projection apparatus, the method comprising: providing a desired pupil profile; calculating a discrete pupil profile based on the desired pupil profile; selecting a discrete change to the discrete pupil profile; and applying the selected discrete change to the discrete pupil profile.

According to an embodiment, the desired pupil profile is a pupil profile from an optimization or an empirical pupil profile.

According to an embodiment, the discrete pupil profile is renderable by hardware of an illumination source of the lithographic projection apparatus.

According to an embodiment, the discrete pupil profile comprises intensities at a plurality of spatially discrete positions on a pupil plane.

According to an embodiment, the method further comprises optimizing design variables unassociated to source hardware that causes discrete change in the discrete pupil profile.

According to an embodiment, the method further comprises iterating selecting a discrete change to the discrete pupil profile and applying the discrete change to the discrete pupil profile.

According to an embodiment, the hardware of the illumination source comprises an array of mirrors.

According to an embodiment, selecting a discrete change comprises calculating a plurality of gradients of a cost function, each of the plurality of gradients with respect to intensity at one of a plurality of spatially discrete positions on a pupil plane.

According to an embodiment, the plurality of spatially discrete positions are positions at which intensity can change by adjusting hardware of an illumination source of the lithographic projection apparatus.

According to an embodiment, at least one mirror in the array of mirrors has at least two discrete states.

According to an embodiment, the at least one mirror changing from one of the at least two discrete states to another of the at least two discrete states cause generates a discrete change in intensity at one or more positions on a pupil plane.

According to an embodiment, selecting a discrete change comprises selecting the discrete change from a plurality of discrete changes.

According to an embodiment, at least one discrete change in the plurality of discrete changes includes is a discrete change in intensity at one or more of discrete positions of the discrete pupil profile.

According to an embodiment, at least one discrete change in the plurality of discrete changes includes all possible discrete changes that could be caused by changing only one, only two, only three, and/or only four mirrors in an array of mirrors in an illumination source from one state to another state generates.

According to an embodiment, the plurality of discrete changes exclusively includes those discrete changes that do not change maintain a total intensity in the discrete pupil profile.

According to an embodiment, the plurality of discrete changes exclusively includes those discrete changes that decrease a fill ratio of the discrete pupil profile.

According to an embodiment, selecting a discrete change further comprises calculating an estimated change in a value of a cost function for each of the plurality of discrete changes.

According to an embodiment, calculating the estimated change comprises summing a product of a change in intensity at each of discrete positions of the discrete pupil profile in the plurality of discrete changes and gradients of a cost function at the discrete positions.

According to an embodiment, selecting a discrete change further comprises selecting the discrete change from the plurality of discrete changes based on the estimated change in a value of a cost function for each of the plurality of discrete changes.

According to an embodiment, selecting the discrete change from the plurality of discrete changes comprises selecting one discrete change from the plurality of discrete changes that has a least or greatest estimated change among all of the plurality of discrete changes.

According to an embodiment, selecting the discrete change from the plurality of discrete changes comprises selecting a subset from the plurality of discrete changes, wherein the estimated change of each in the subset is no greater than the estimated change of any one of the plurality of discrete changes that is not in the subset.

According to an embodiment, selecting the discrete change from the plurality of discrete changes further comprises calculating actual change in value of the cost function for each of the discrete changes in the subset; and selecting one discrete change that causes a greater actual change in value of the cost function than any other in the subset causes.

According to an embodiment, the desired pupil profile is a pupil profile from another lithographic projection apparatus.

According to an embodiment, the plurality of discrete changes includes a discrete change having a symmetry about an optical axis of the lithographic projection apparatus.

According to an embodiment, selecting a discrete change further comprises calculating a change in a value of a cost function for each of the plurality of discrete changes.

According to an embodiment, the desired pupil profile is a pupil profile of an illumination source of the lithographic projection apparatus.

According to an embodiment, the desired pupil profile is a pupil profile of projection optics of the lithographic projection apparatus.

According to an embodiment, the cost function is a function of intensities at the plurality of spatially discrete positions on the pupil plane.

Also described herein is a computer program product comprising a computer readable medium having instructions recorded thereon, the instructions when executed by a computer implementing the method of any of the above embodiments.

Also described herein is a computer-implemented method, wherein the method is implemented in a computer system comprising one or more processors configured to execute one or more computer program modules, the method comprising: executing, on the one or more processors of the computer system, one or more computer program modules configured to execute any one of the methods described herein to produce a discrete pupil profile; and displaying, on an electronic display communicatively linked with the one or more processors of the computer system, the discrete pupil profile.

The methods according to various embodiments disclosed herein may reduce the computational cost of discrete optimization from $O(a^n)$ to $O(n)$ wherein a is constant and n is the number of knobs that can cause discrete change in the pupil profile.

DETAILED DESCRIPTION

Figure 1:
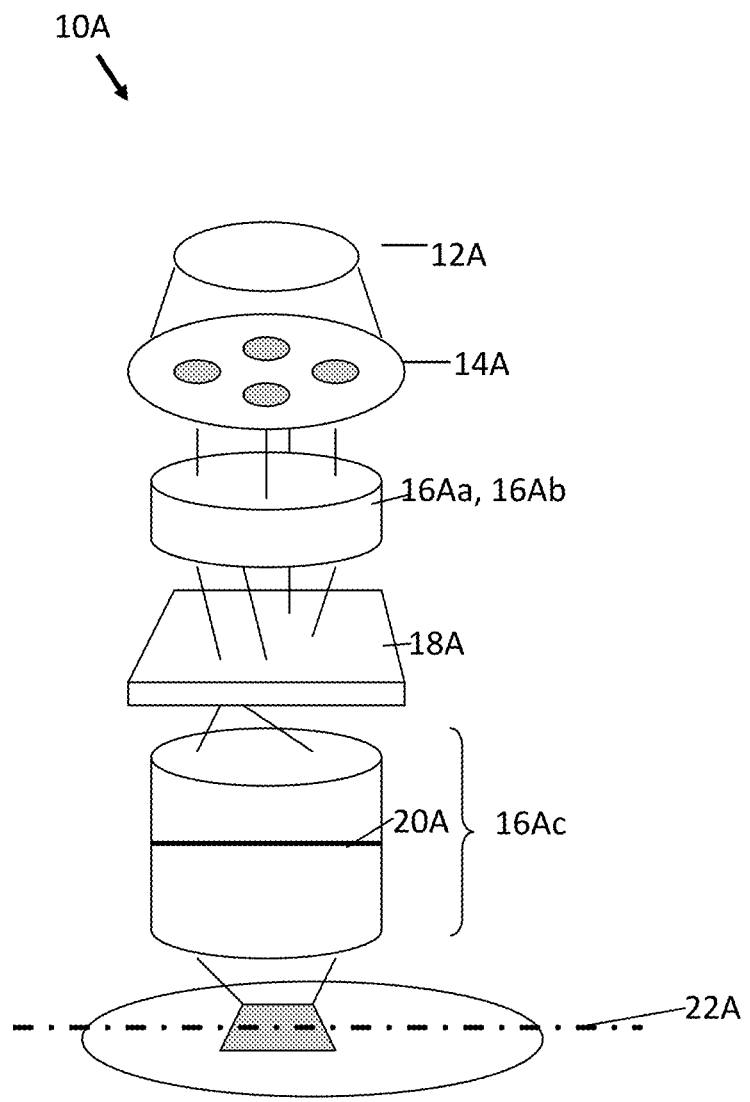
FIG. 1 is a block diagram of various subsystems of a lithography system.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic projection apparatus such that results and/or processes of lithography have more desirable characteristics, such as higher accuracy of projection of design layouts on a substrate, larger process windows, etc.

Further, the lithographic projection apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above comprises or can form design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=sin ($\Theta_{max}$).

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (i.e., worst deviation). The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithographic projection apparatus, a source provides illumination (i.e. light); projection optics direct and shapes the illumination via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. 2009/0157360, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
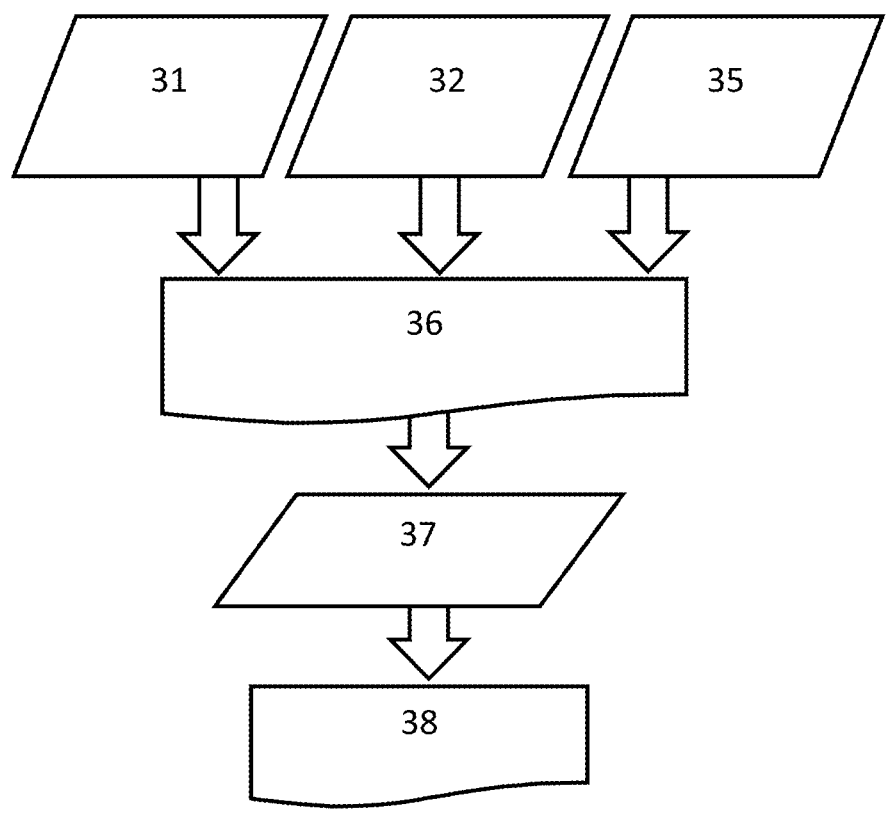
FIG. 2 is a block diagram of simulation models corresponding to the subsystems in FIG. 1.

An exemplary flow chart for simulating lithography in a lithographic projection apparatus is illustrated in FIG. 2. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 37 can be simulated from the aerial image 36 using a resist model 37. Simulation of lithography can, for example, predict contours and CDs in the resist image 38.

More specifically, it is noted that the source model 31 can represent the optical characteristics of the source that include, but not limited to, NA-sigma ($\sigma$) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical patterning device, as described, for example, in U.S. Pat. No. 7,587,704, which is incorporated by reference in its entirety. The objective of the simulation is to accurately predict, for example, edge placements, aerial image intensity slopes and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

In a lithographic projection apparatus, as an example, a cost function is expressed as $$CF(z_1, z_2, \ldots, z_N) = \sum_{p=1}^{P} w_p f_p^2(z_1, z_2, \ldots, z_N) \quad \text{(Eq. 1)}$$

wherein $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic at an evaluation point for a set of values of the design variables of $(z_1, z_2, \ldots, z_N)$. $w_p$ is a weight constant associated with $f_p(z_1, z_2, \ldots, z_N)$. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, any point on a virtual design layout, or resist image, or aerial image, or a combination thereof. $f_p(z_1, z_2, \ldots, z_N)$ can also be a function of one or more stochastic effects such as the line width roughness (LWR), which are functions of the design variables $(z_1, z_2, \ldots, z_N)$. The cost function may represent any suitable characteristics of the lithographic projection apparatus or the substrate, for instance, focus, CD, image shift, image distortion, image rotation, stochastic effects, throughput, CDU, or a combination thereof. CDU is local CD variation (e.g., three times of the standard deviation of the local CD distribution). In one embodiment, the cost function represents (i.e., is a function of) CDU, throughput, and the stochastic effects. In one embodiment, the cost function represents (i.e., is a function of) EPE, throughput, and the stochastic effects. In one embodiment, the design variables $(z_1, z_2, \ldots, z_N)$ comprise dose, global bias of the patterning device, shape of illumination from the source, or a combination thereof. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the source, the patterning device, the projection optics, dose, focus, etc. The projection optics may include components collectively called as "wavefront manipulator" that can be used to adjust shapes of a wavefront and intensity distribution and/or phase shift of the irradiation beam. The projection optics preferably can adjust a wavefront and intensity distribution at any location along an optical path of the lithographic projection apparatus, such as before the patterning device, near a pupil plane, near an image plane, near a focal plane. The projection optics can be used to correct or compensate for certain distortions of the wavefront and intensity distribution caused by, for example, the source, the patterning device, temperature variation in the lithographic projection apparatus, thermal expansion of components of the lithographic projection apparatus. Adjusting the wavefront and intensity distribution can change values of the evaluation points and the cost function. Such changes can be simulated from a model or actually measured. Of course, $CF(z_1, z_2, \ldots, z_N)$ is not limited the form in Eq. 1. $CF(z_1, z_2, \ldots, z_N)$ can be in any other suitable form.

It should be noted that the normal weighted root mean square (RMS) of $f_p(z_1, z_2, \ldots, z_N)$ is defined as $$\sqrt{\frac{1}{P}\sum_{p=1}^{P} w_p f_p^2(z_1, z_2, \ldots, z_N)},$$

therefore, minimizing the weighted RMS of $f_p(z_1, z_2, \ldots, z_N)$ is equivalent to minimizing the cost function $$CF(z_1, z_2, \ldots, z_N) = \sum_{p=1}^{P} w_p f_p^2(z_1, z_2, \ldots, z_N),$$

defined in Eq. 1. Thus the weighted RMS of $f_p(z_1, z_2, \ldots, z_N)$ and Eq. 1 may be utilized interchangeably for notational simplicity herein.

Further, if considering maximizing the PW (Process Window), one can consider the same physical location from different PW conditions as different evaluation points in the cost function in (Eq.1). For example, if considering N PW conditions, then one can categorize the evaluation points according to their PW conditions and write the cost functions as:

$$CF(z_1, z_2, \ldots, z_N) = \quad \text{(Eq. 1')}$$
$$\sum_{p=1}^{P} w_p f_p^2(z_1, z_2, \ldots, z_N) = \sum_{u=1}^{U} \sum_{p_u=1}^{P_u} w_{p_u} f_{p_u}^2(z_1, z_2, \ldots, z)$$

Where $f_{p_u}(z_1, z_2, \ldots, z_N)$ is the value of $f_p(z_1, z_2, \ldots, z_N)$ under the u-th PW condition $u=1, \ldots, U$. When $f_p(z_1, z_2, \ldots, z_N)$ is the EPE, then minimizing the above cost function is equivalent to minimizing the edge shift under various PW conditions, thus this leads to maximizing the PW. In particular, if the PW also consists of different mask bias, then minimizing the above cost function also includes the minimization of MEEF (Mask Error Enhancement Factor), which is defined as the ratio between the substrate EPE and the induced mask edge bias.

The design variables may have constraints, which can be expressed as $(z_1, z_2, \ldots, z_N) \in Z$, where Z is a set of possible values of the design variables. One possible constraint on the design variables may be imposed by a desired throughput of the lithographic projection apparatus. The desired throughput may limit the dose and thus has implications for the stochastic effects (e.g., imposing a lower bound on the stochastic effects). Higher throughput generally leads to lower dose, shorter longer exposure time and greater stochastic effects. Consideration of substrate throughput and minimization of the stochastic effects may constrain the possible values of the design variables because the stochastic effects are function of the design variables. Without such a constraint imposed by the desired throughput, the optimization may yield a set of values of the design variables that are unrealistic. For example, if the dose is among the design variables, without such a constraint, the optimization may yield a dose value that makes the throughput economically impossible. However, the usefulness of constraints should not be interpreted as a necessity.

The optimization process therefore is to find a set of values of the design variables, under the constraints $(z_1, z_2, \ldots, z_N) \in Z$, that minimize the cost function, i.e., to find $$(\tilde{z}_1, \tilde{z}_2, \ldots \tilde{z}_N) = \underset{(z_1, z_2, \ldots, z_N) \in Z}{\operatorname{argmin}} CF(z_1, z_2, \ldots, z_N) = \quad \text{(Eq. 2)}$$

$$\underset{(z_1, z_2, \ldots, z_N) \in Z}{\operatorname{argmin}} \sum_{p=1}^{P} w_p f_p^2(z_1, z_2, \ldots, z_N)$$

Figure 3:
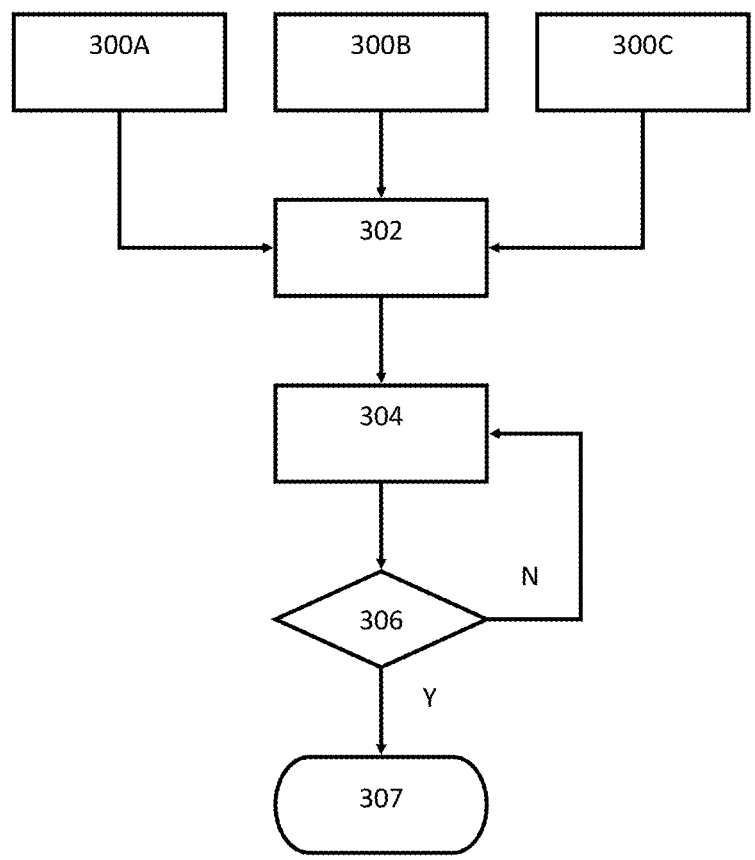
FIG. 3 is a flow diagram illustrating aspects of an example methodology of joint optimization.

A general method of optimizing the lithography projection apparatus, according to an embodiment, is illustrated in FIG. 3. This method comprises a step 302 of defining a multi-variable cost function of a plurality of design variables. The design variables may comprise any suitable combination selected from characteristics of the illumination source (300A) (e.g., pupil fill ratio, namely percentage of radiation of the source that passes through a pupil or aperture; pupil profile, namely spatial intensity distribution on the pupil plane), characteristics of the projection optics (300B) and characteristics of the design layout (300C). For example, the design variables may include characteristics of the illumination source (300A) and characteristics of the design layout (300C) (e.g., global bias) but not characteristics of the projection optics (300B), which leads to a SMO. Alternatively, the design variables may include characteristics of the illumination source (300A), characteristics of the projection optics (300B) and characteristics of the design layout (300C), which leads to a source-mask-lens optimization (SMLO). In step 304, the design variables are simultaneously adjusted so that the cost function is moved towards convergence. In step 306, it is determined whether a predefined termination condition is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iterations is reached. If either of the conditions in step 306 is satisfied, the method ends. If none of the conditions in step 306 is satisfied, the steps 304 and 306 are iteratively repeated until a desired result is obtained. If any of the conditions in step 306 is satisfied, the method ends in step 307.

In a lithographic projection apparatus, the source, patterning device and projection optics can be optimized alternatively (referred to as Alternative Optimization) or optimized simultaneously (referred to as Simultaneous Optimization). The terms "simultaneous", "simultaneously", "joint" and "jointly" as used herein mean that the design variables of the characteristics of the source, patterning device, projection optics and/or any other design variables, are allowed to change at the same time. The term "alternative" and "alternatively" as used herein mean that not all of the design variables are allowed to change at the same time.

Figure 4:
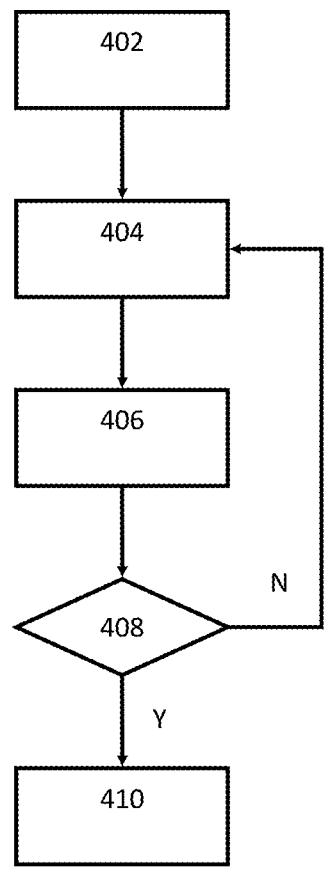
FIG. 4 is a flow diagram illustrating aspects of an example methodology of alternative optimization.

In FIG. 3, the optimization of all the design variables is executed simultaneously. Such flow may be called the simultaneous flow or co-optimization flow. Alternatively, the optimization of all the design variables is executed alternatively, as illustrated in FIG. 4. In this flow, in each step, some design variables are fixed while the other design variables are optimized to minimize the cost function; then in the next step, a different set of variables are fixed while the others are optimized to minimize the cost function. These steps are executed alternatively until convergence or certain terminating conditions are met. As shown in the non-limiting example flowchart of FIG. 4, first, a design layout (step 402) is obtained, then a step of source optimization is executed in step 404, where all the design variables of the illumination source are optimized (SO) to minimize the cost function while all the other design variables are fixed. Then in the next step 406, a mask optimization (MO) is performed, where all the design variables of the patterning device are optimized to minimize the cost function while all the other design variables are fixed. These two steps are executed alternatively, until certain terminating conditions are met in step 408. Various termination conditions can be used, such as, the value of the cost function becomes equal to a threshold value, the value of the cost function crosses the threshold value, the value of the cost function reaches within a preset error limit, or a preset number of iterations is reached, etc. Note that SO-MO-Alternative-Optimization is used as an example for the alternative flow. The alternative flow can take many different forms, such as SO-LO-MO-Alternative-Optimization, where SO, LO (Lens Optimization) is executed, and MO alternatively and iteratively; or first SMO can be executed once, then execute LO and MO alternatively and iteratively; and so on. Finally the output of the optimization result is obtained in step 410, and the process stops.

The pattern selection algorithm, as discussed before, may be integrated with the simultaneous or alternative optimization. For example, when an alternative optimization is adopted, first a full-chip SO can be performed, the 'hot spots' and/or 'warm spots' are identified, then an MO is performed. In view of the present disclosure numerous permutations and combinations of sub-optimizations are possible in order to achieve the desired optimization results.

Traditional technology uses glass discs called diffractive optical elements (DOEs) to shape the light from the source. The light from the source can be characterized using the pupil profile, i.e., spatial intensity distribution at the pupil plane. For complex pupil profiles, these DOEs have to be custom designed and manufactured.

Applicant's FlexRay™ source uses a programmable array of individually adjustable mirrors. It can create any pupil profile in a matter of minutes—eliminating the long cycle time associated with DOE design and fabrication and thus accelerating ramp to yield for low $k_1$ designs.

Although the number of the adjustable mirrors may be as large as several hundred, they are still spatially discrete. In some lithographic projection systems, the mirrors are not continuously adjustable—namely each mirror can be in several (e.g., 2-6) discrete states. Due to the discrete nature of the mirrors, the pupil profile actually rendered using the array of mirrors resembles but may still substantially deviate from the desired pupil profile. The desired pupil profile may be obtained from SO, SMO, SMLO, empirical pupil profile, pupil profile from another lithographic projection system, etc. This deviation tends to be greater in an EUV source. This deviation may be reduced if the discrete nature of the mirrors is taken into account when the source is optimized. However, traditional discrete optimization (e.g., branch-and-bound algorithm) is computational costly (with run time increasing exponentially with the number of mirrors), namely $O(a^n)$, wherein a is a constant and n is the number of mirrors. The methods according to various embodiments disclosed herein may reduce the computational cost to be proportional to the number of mirrors, namely $O(n)$.

Figure 5:
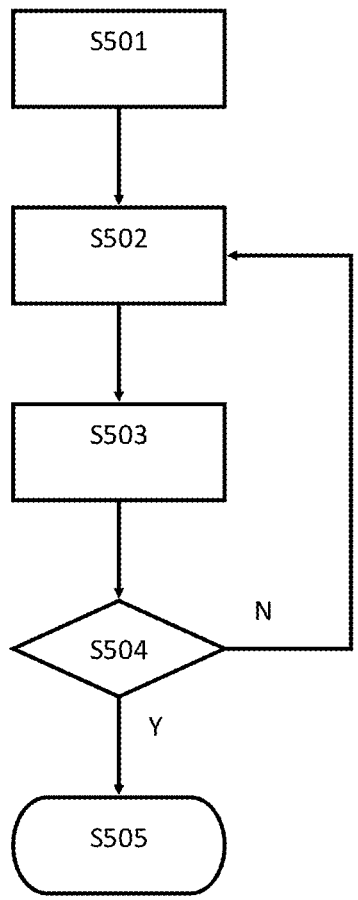
FIG. 5 is a flow diagram illustrating a method, according to embodiment.

FIG. 5 shows a method, according to an embodiment. The method shown in FIG. 5 has a run time essentially proportional to the number of mirrors. In step S501, the desired pupil profile is provided, wherein the desired pupil profile may be any suitable pupil profile, such as a pupil profile from an optimization or an empirical pupil profile; an initial discrete pupil profile resembling the desired pupil profile and renderable by hardware of the source (e.g., renderable by the array of mirrors) is then calculated using any suitable method based on the desired pupil profile; and the initial discrete pupil profile is designated as the current discrete pupil profile. A discrete pupil profile comprises intensity at the plurality of spatially discrete positions on the pupil plane. In step S502, a discrete change to the current discrete pupil profile is selected and applied to the current discrete pupil profile. The current discrete pupil profile with the selected discrete change becomes the current discrete profile in the next iteration. In step S503, design variables unassociated to source hardware (e.g., such source hardware may include the mirrors) that causes discrete change in discrete pupil profile (e.g., design variables associated with the patterning device, the dose, etc.) are optimized with the pupil profile fixed, wherein these design variables could include discrete and/or continuous design variables. If step S504, if an end condition is satisfied, the method ends in step S505; if no end condition is satisfied, steps S502-S504 are iterated. Of course, the discrete pupil profile is not limited to those that are created by an array of mirrors, but include all discrete pupil profiles that can be created by any suitable source hardware.

Figure 6:
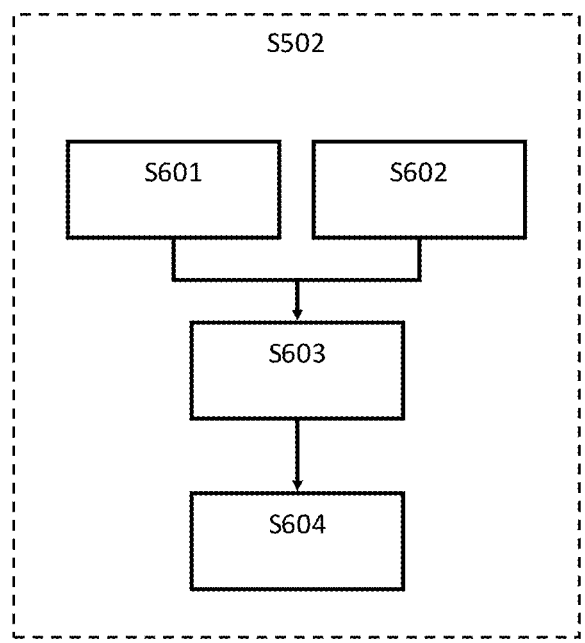
FIG. 6 shows details of a step S502 in FIG. 5, according to an embodiment.

Details of step S502 are illustrated in the flow chart in FIG. 6, according to an embodiment. In step S601, a plurality of gradients of the cost function CF is calculated, each of the plurality of gradients with respect to intensity at one of a plurality of spatially discrete positions on the pupil plane. For clarify, these gradients are represented as $$g_i = \frac{\partial CF}{\partial I_i}, (i = 1, 2, \ldots, p),$$ (Eq. 3)

wherein $I_i$ is the intensity at position i on the pupil plane, p is the number of discrete positions on the discrete pupil profile, and CF is the cost function. In an embodiment, these positions are those where intensity can discretely change by adjusting the mirrors. For example, in some systems, each mirror has two discrete states, one of which causes a position on the pupil plane to have a finite intensity and the other of which causes the position on the pupil plane to have essentially zero intensity. In other systems, the mirrors can have more than two discrete states. No matter how many discrete states each mirror has, changing one mirror from one of these discrete states to another causes discrete change in intensity at one or more positions on the pupil plane.

In step S602, a plurality of discrete changes in the current discrete pupil profile are selected. Each of the plurality of discrete changes may include discrete changes in intensity at one or more of the discrete positions of the current discrete pupil profile. This plurality of discrete changes can include any suitable number of discrete changes. For example, the plurality of discrete changes includes an intensity change from essential zero to a finite intensity at one of the discrete positions of the current discrete pupil profile, and an intensity change from a finite intensity to essential zero at one of the discrete positions of the current discrete pupil profile. In another example, the plurality of discrete changes includes intensity changes between essential zero and a finite intensity at two of the discrete positions of the current discrete pupil profile. In another example, the plurality of discrete changes includes all discrete changes that could be caused by changing only one of the mirrors from one state to another. In yet another example, the plurality of discrete changes includes all discrete changes that could be caused by changing only two, only three, or only four of the mirrors from one state to another. For clarity, intensity change at position i in the u-th member of the plurality of discrete changes are represented as $\Delta I_{u,i}$. In yet another example, the plurality of discrete changes only includes those that maintain the total intensity in the discrete pupil profile; such a plurality of discrete changes keeps the illumination efficiency constant. In still another example, the plurality of discrete changes includes discrete changes having a symmetry (e.g., C2, D2, D4, etc.) about the optical axis of the lithographic projection apparatus; these discrete changes having a symmetry may be caused by changing a group of mirrors together from one state to another; and these discrete changes may preserve the symmetry of illumination source and/or speed up the optimization. Other constraints may be imposed to the selection of the plurality of discrete changes. For example, a constraint may be that the plurality of discrete changes decreases the fill ratio and thus increase the exposure latitude. For example, a constraint may be that the plurality of discrete changes only includes those discrete changes that keep a mirror in the array of mirrors in a state that the mirror does not project light onto the pupil plane. In an embodiment, the cost function may be a function of the fill ratio, the exposure latitude, the depth of focus, and/or other metrics of the process window.

In step S603, an estimated change in the value of the cost function is calculated for each of the plurality of discrete changes, as $$\Delta CF_u = \sum_{i=1}^{p} \Delta I_{u,i} \cdot g_i.$$ (Eq. 4)

Namely, the estimated change in the value of the cost function for the u-th discrete change is calculated by summing a product of the change in intensity at each of the discrete positions of the discrete pupil profile in the u-th discrete change and the gradient of the cost function at that discrete position. In another embodiment, the actual change in the value of the cost function may be calculated for each of the plurality of discrete changes as, $CF_u(I_{u,i}+\Delta I_{u,i})-CF_u(I_{u,i})$.

In step S604, one of the plurality of discrete changes is selected, based on the plurality of estimated changes in the value of the cost function.

Figure 7A:
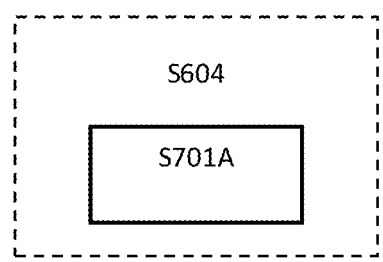
FIG. 7A shows details of a step S604 in FIG. 6, according to an embodiment.

The selection in step S604 may be performed by a method illustrated in FIG. 7A according to an embodiment. In step S701A, the selected discrete change is the one whose $\Delta CF_u$ is the least among all of the plurality of discrete changes. Alternatively, the selected discrete change is the one whose $\Delta CF_u$ is the greatest among all of the plurality of discrete changes.

Figure 7B:
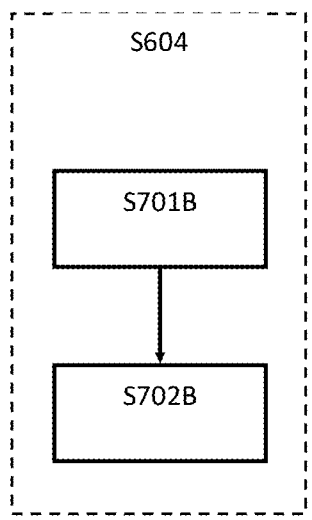
FIG. 7B shows details of a step S604 in FIG. 6, according to an embodiment.

The selection in step S604 may also be performed by a method illustrated in FIG. 7B according to another embodiment. In step S701B, a subset (e.g., a subset including 10 discrete changes) from the plurality of discrete changes are identified, wherein $\Delta CF_u$ of those in the subset are no greater (or smaller) than $\Delta CF_u$ of any one of the plurality of discrete changes that is not in the subset. For example, $\Delta CF_u$ for the plurality of discrete changes are −100, −90, −80, ..., 0, 10, 20, ... 80, 90, 100; the subset may be chosen to include five discrete changes whose $\Delta CF_u$ are −100, −90, −80, −70, −60. In step S702B, actual change in value of the cost function for each of the discrete changes in the subset is calculated; the selected discrete change is the one that generates a greater actual change in value of the cost function than any other in the subset generates.

Figure 8A:
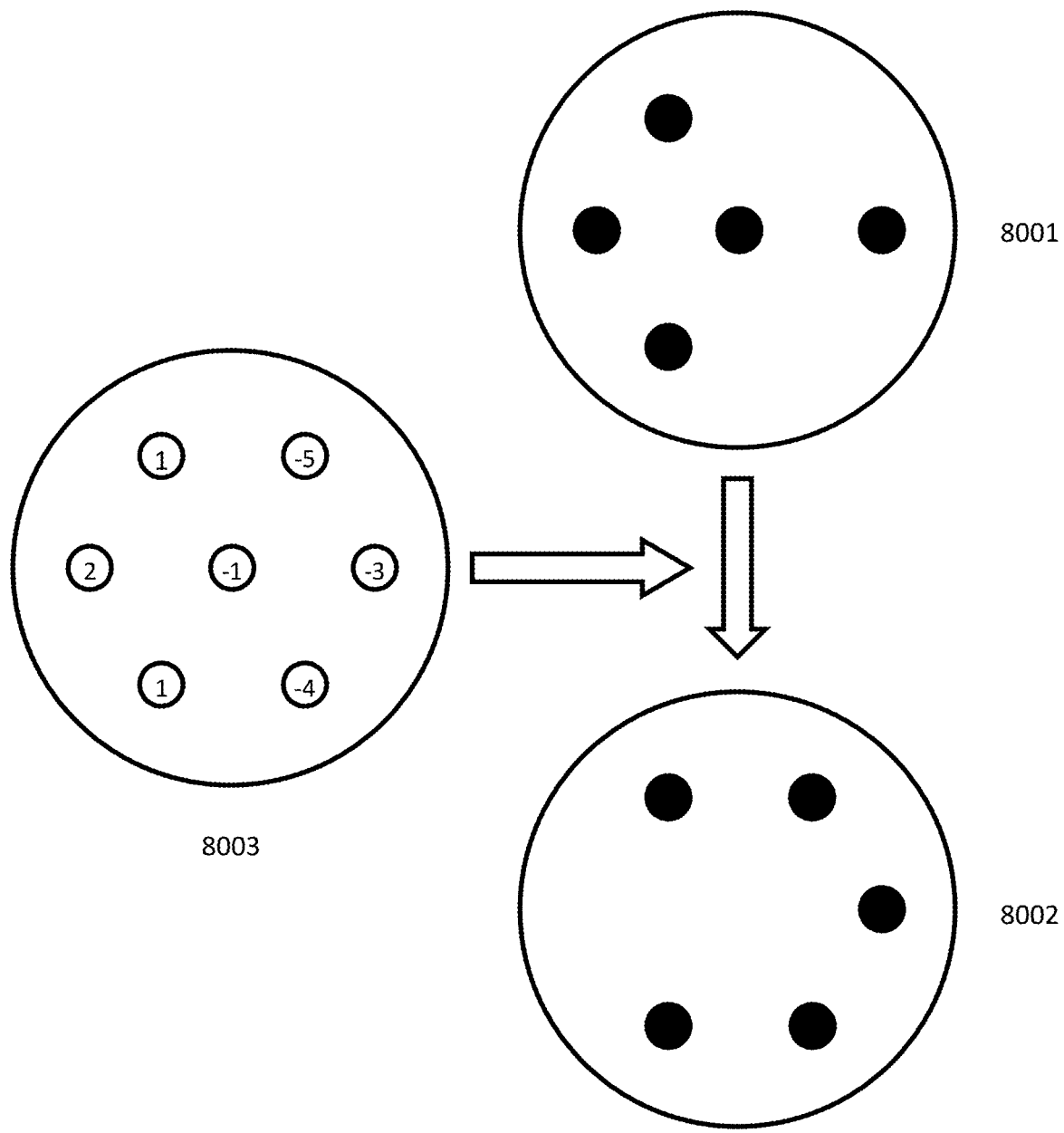
FIG. 8A and FIG. 8B illustrate how the estimated changes in the value of the cost function $\Delta CF_u$ are calculated.
Figure 8B:
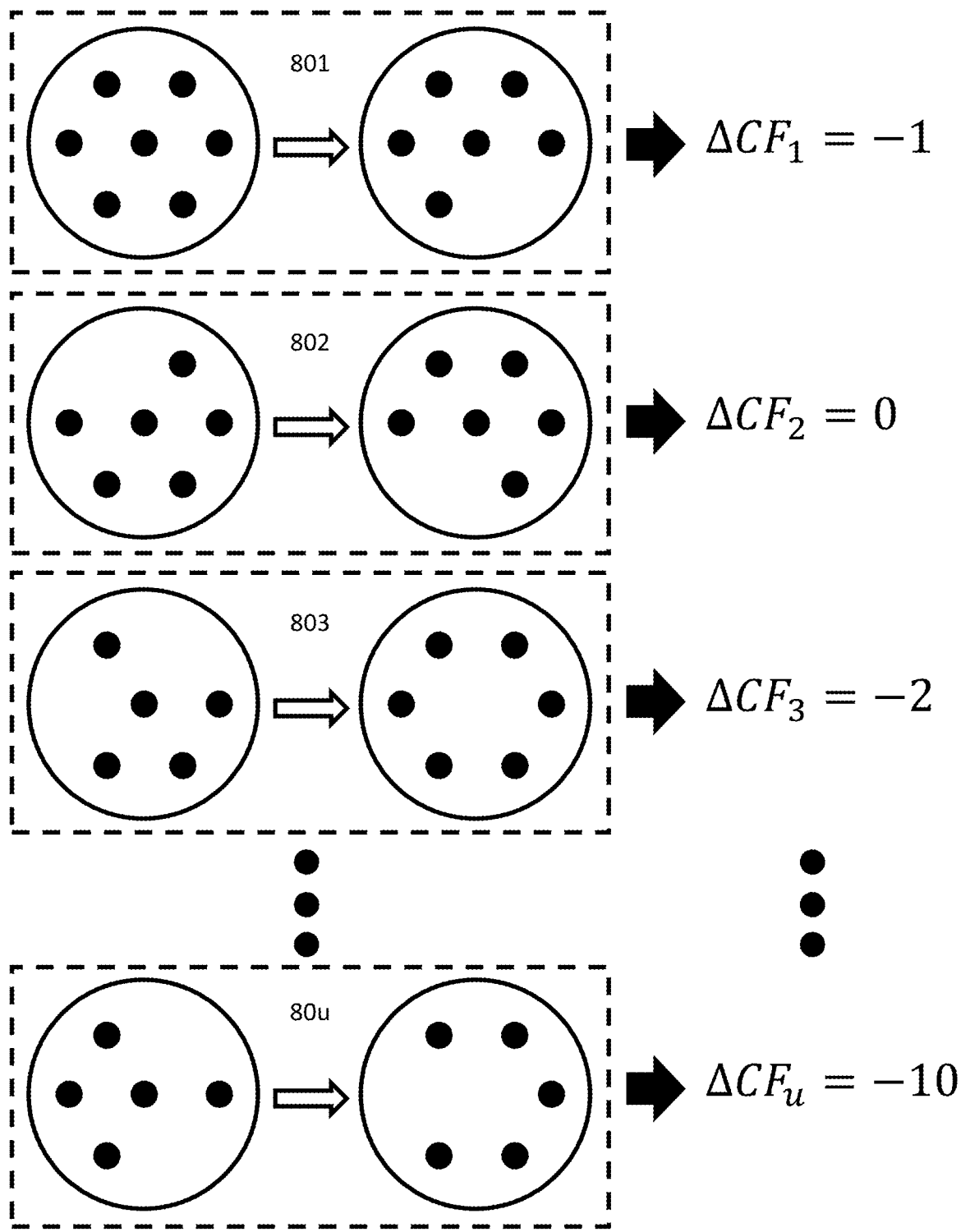

FIG. 8A and FIG. 8B further illustrate how the estimated changes in the value of the cost function $\Delta CF_u$ are calculated. In this simplified example, there are only seven discrete positions in the discrete pupil profile. In practice, the discrete pupil profile could have hundreds or more discrete positions. In this simplified example, each position has only two possible intensities: 1 (black dot) and 0 (no dot). In practice, each position could have more than two possible intensities. In one of the discrete changes, 80u, the discrete pupil profile changes from the profile illustrated as 8001 to the profile illustrated as 8002. The gradients of the cost function are illustrated as 8003. $\Delta CF_u=(0\times 1)+(1\times -5)+(-1\times 2)+(-1\times -1)+(0\times -3)+(0\times 1)+(1\times -4)=-10$. FIG. 8B shows several estimated changes in the value of the cost function for several other discrete changes 801, 802, and 803.

Figure 9:
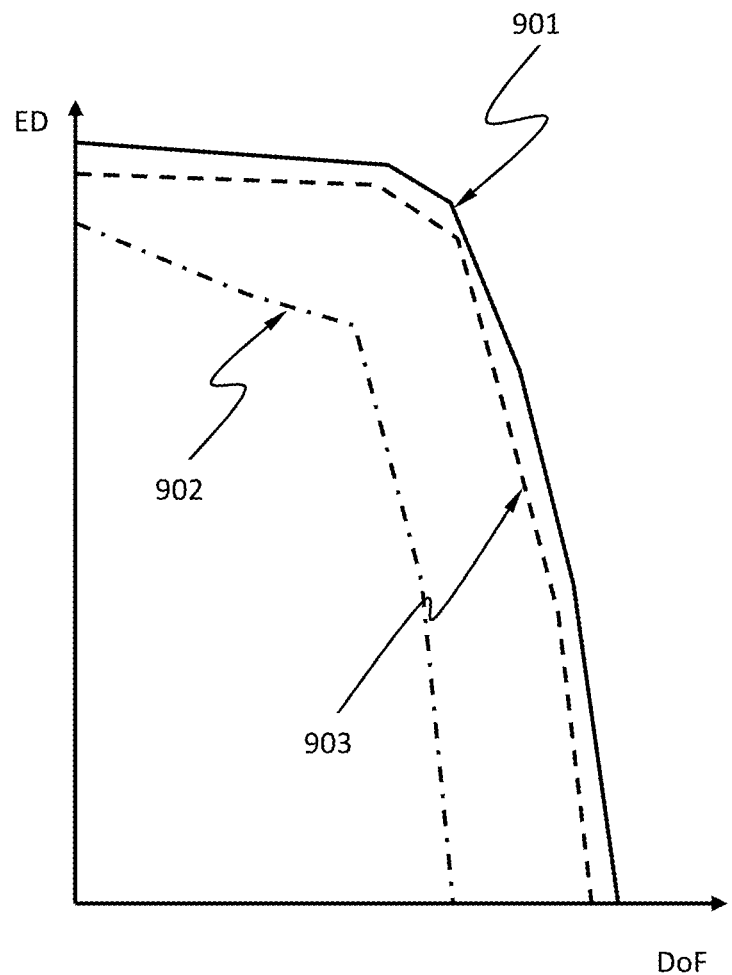
FIG. 9 shows an exemplary result from the method illustrated in FIGS. 5, 6, 7A and 7B.

FIG. 9 shows an exemplary result from the method illustrated in FIGS. 5, 6, 7A and 7B. Trace 901 is the process window associated with the desired pupil profile. Trace 902 is the process window associated with the initial discrete pupil profile. Trace 903 is the process window associated with the discrete pupil profile as a result of the method in illustrated in FIGS. 5, 6, 7A and 7B.

Figure 10:
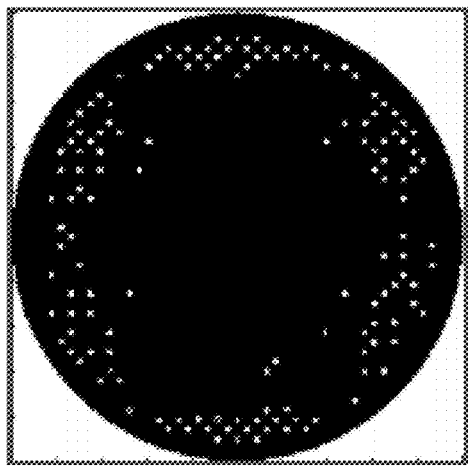
FIG. 10 shows an exemplary result from applying the method illustrated in FIGS. 5, 6, 7A and 7B to match the performance of a "source" lithographic projection system to a "target" lithographic projection system.
Figure 10:
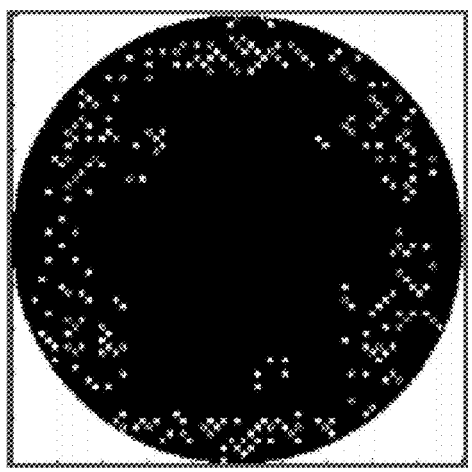
Figure 10:
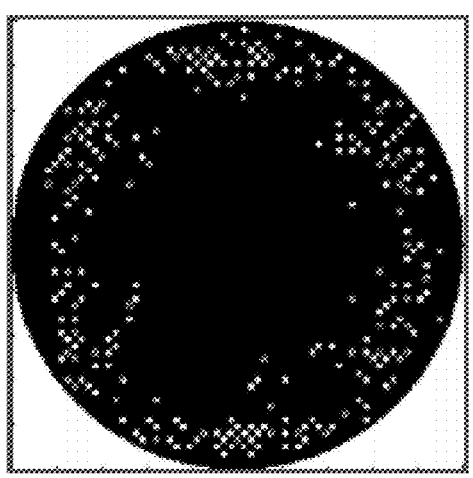
Figure 10:
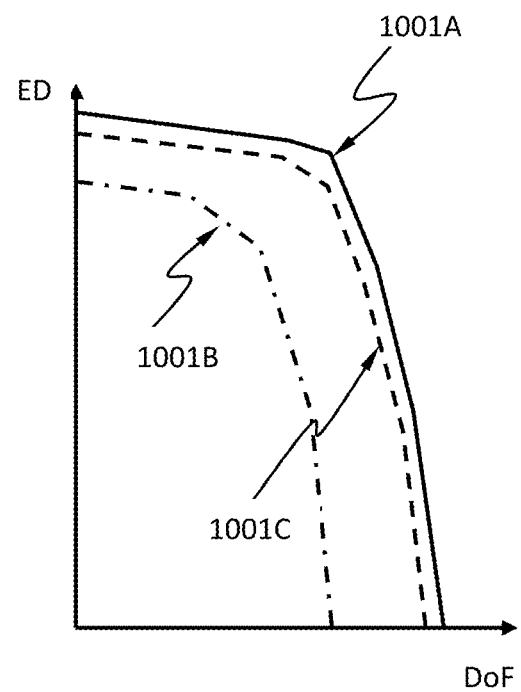

The method illustrated in FIGS. 5, 6, 7A and 7B may also be used to match the performance of a "source" lithographic projection system to a "target" lithographic projection system, no matter these two systems are two copies of a same model or two systems of different models. The pupil profile of the "source" lithographic projection system may be used in the method illustrated in FIGS. 5, 6, 7A and 7B as the desired pupil profile. The desired pupil profile may be from a process of source-mask optimization (SMO). FIG. 10 shows an exemplary result wherein the pupil profile of the "source" lithographic projection system is 1000A; the initial discrete pupil profile of the "target" lithographic projection system in the method illustrated in FIGS. 5, 6, 7A and 7B is 1000B; the result discrete pupil profile of the "target" lithographic projection system is 1000C. The process windows associated with these pupil profiles are also included in FIG. 10 wherein trace 1001A is the process window associated with 1000A, 1001B is the process window associated with 1000B, and 1001C is the process window associated with 1000C.

Figure 11:
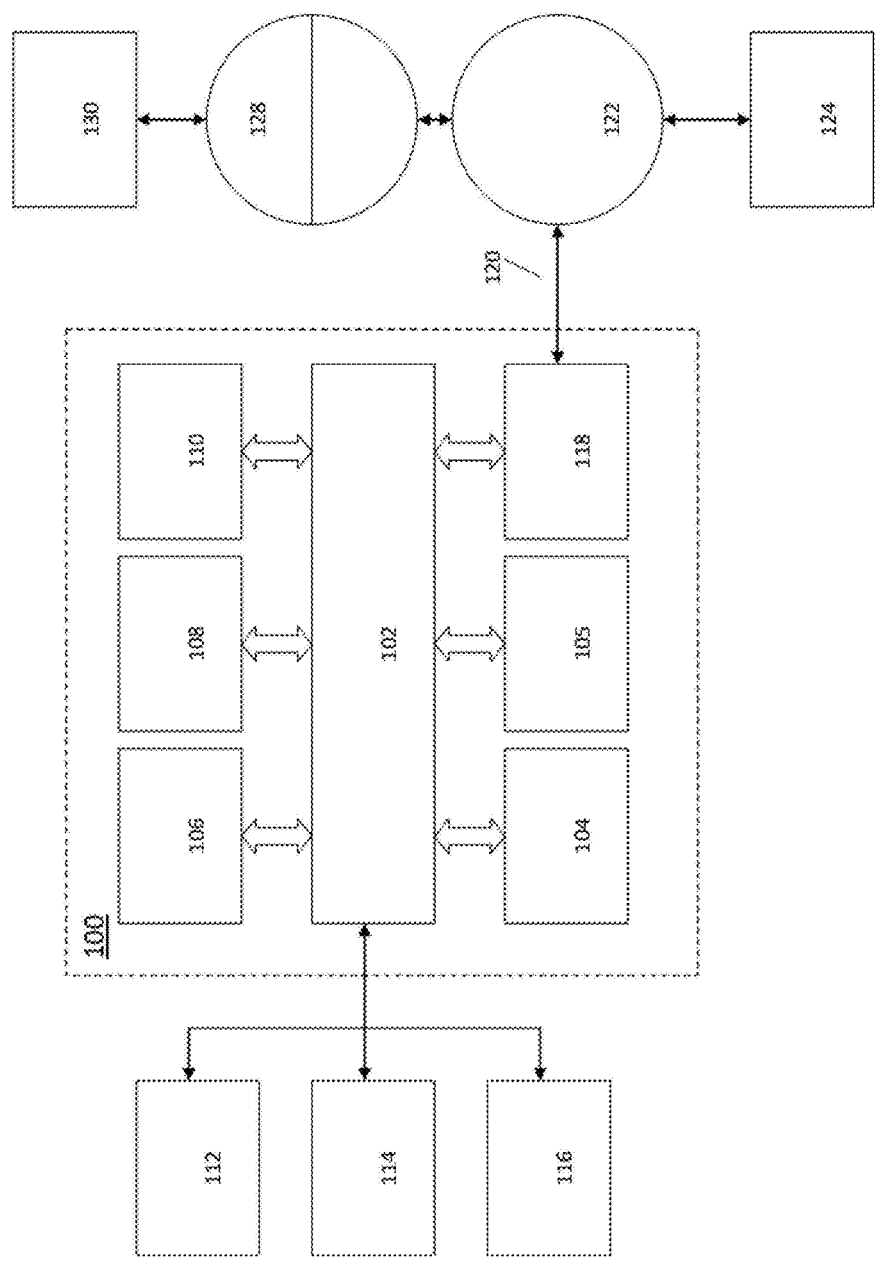
FIG. 11 is a block diagram of an example computer system.

FIG. 11 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 12:
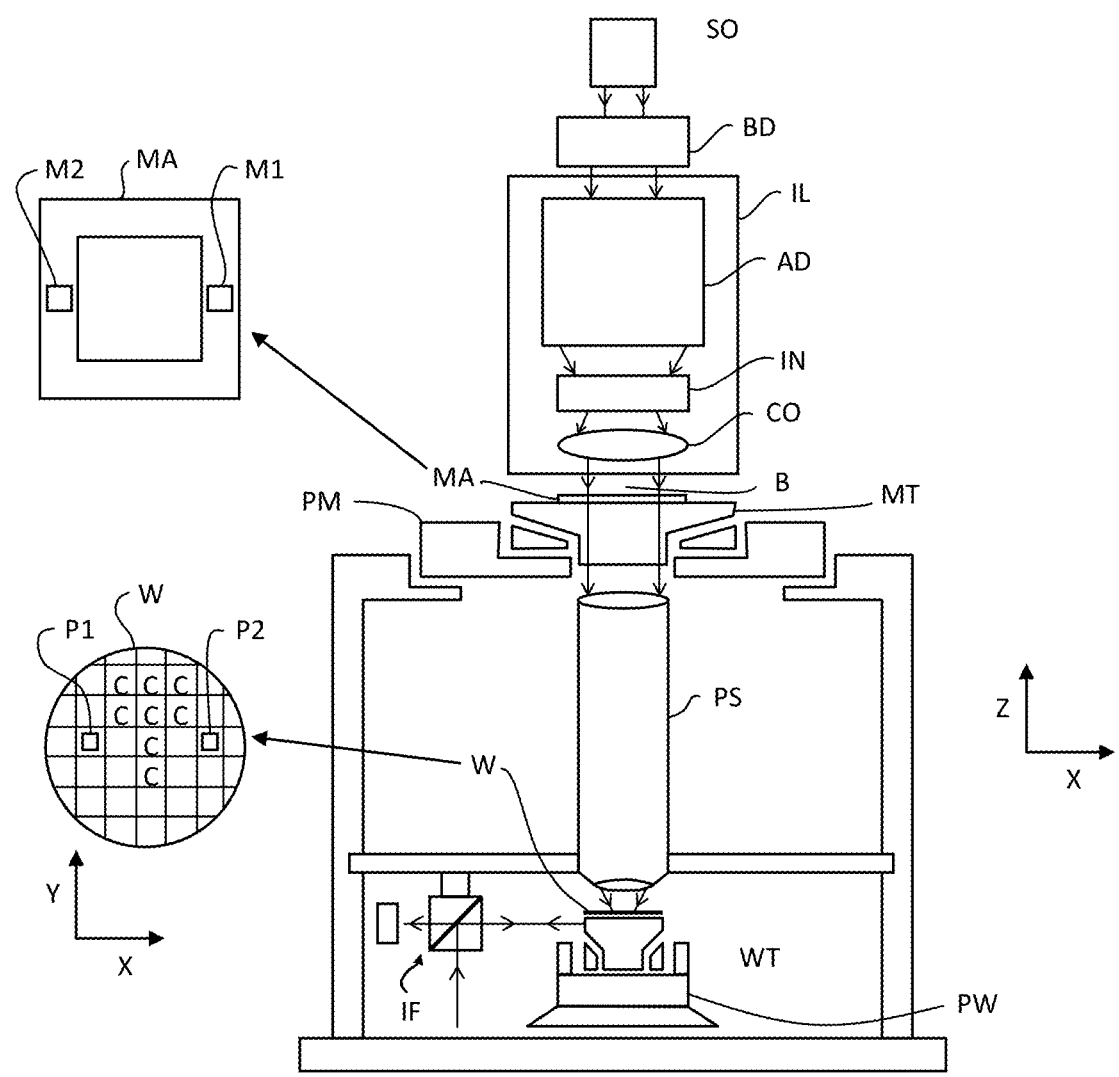
FIG. 12 is a schematic diagram of a lithographic projection apparatus.

FIG. 12 schematically depicts an exemplary lithographic projection apparatus whose illumination source could be optimized utilizing the methods described herein. The apparatus comprises:
- an illumination system IL, to condition a beam B of radiation. In this particular case, the illumination system also comprises a radiation source SO;
- a first object table (e.g., mask table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS;
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 11 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 11. However, in the case of a wafer stepper (as opposed to a step-and-scan tool) the patterning device table MT may just be connected to a short stroke actuator, or may be fixed.

The depicted tool can be used in two different modes:
- In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=1/4 or 1/5). In this manner, a relatively large target portion C can be exposed, without having to compromise on resolution.

Figure 13:
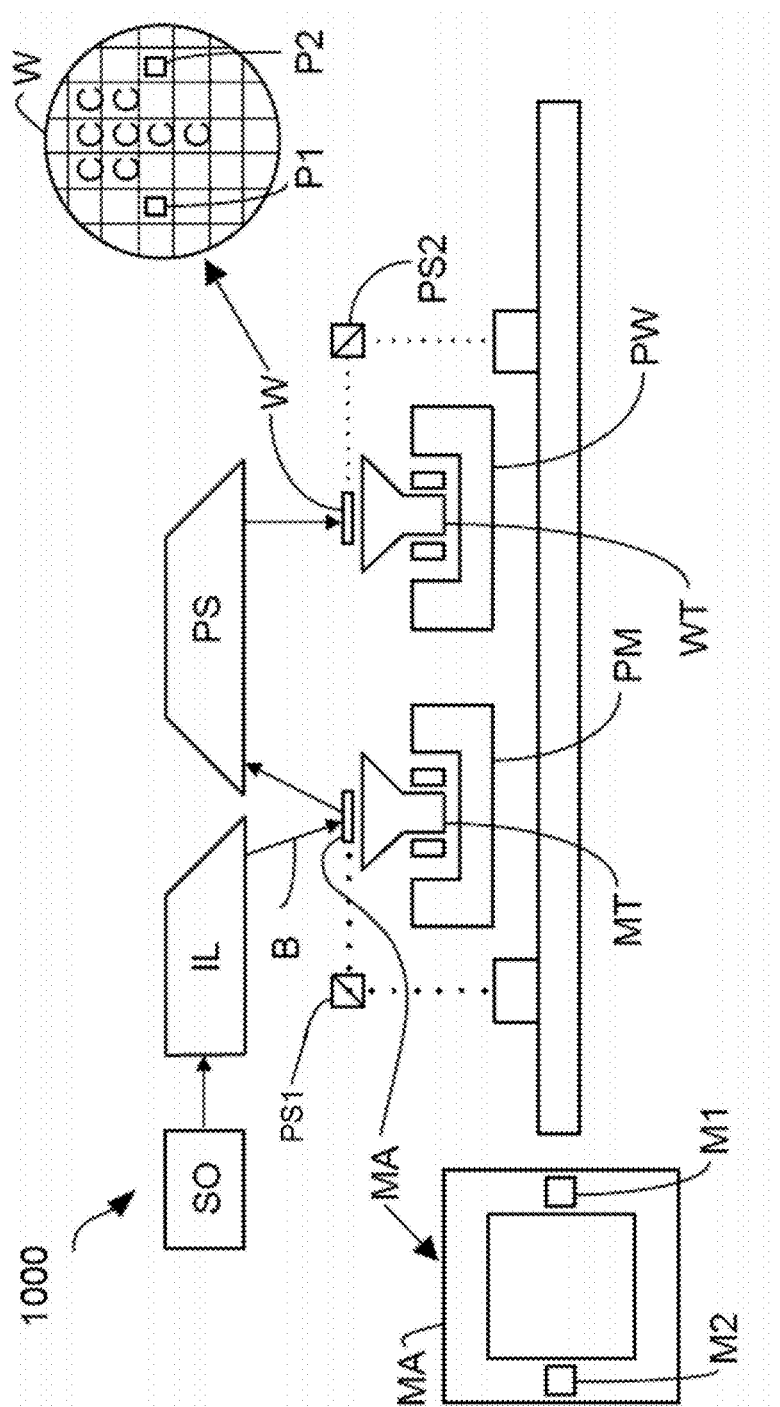
FIG. 13 is a schematic diagram of another lithographic projection apparatus.

FIG. 13 schematically depicts another exemplary lithographic projection apparatus 1000 whose illumination source could be optimized utilizing the methods described herein.

The lithographic projection apparatus 1000 includes:
a source collector module SO
an illumination system (illuminator) IL configured to condition a radiation beam B (e.g. EUV radiation).
a support structure (e.g. a mask table) MT constructed to support a patterning device (e.g. a mask or a reticle) MA and connected to a first positioner PM configured to accurately position the patterning device;
a substrate table (e.g. a wafer table) WT constructed to hold a substrate (e.g. a resist coated wafer) W and connected to a second positioner PW configured to accurately position the substrate; and
a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 13, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 13, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 14:
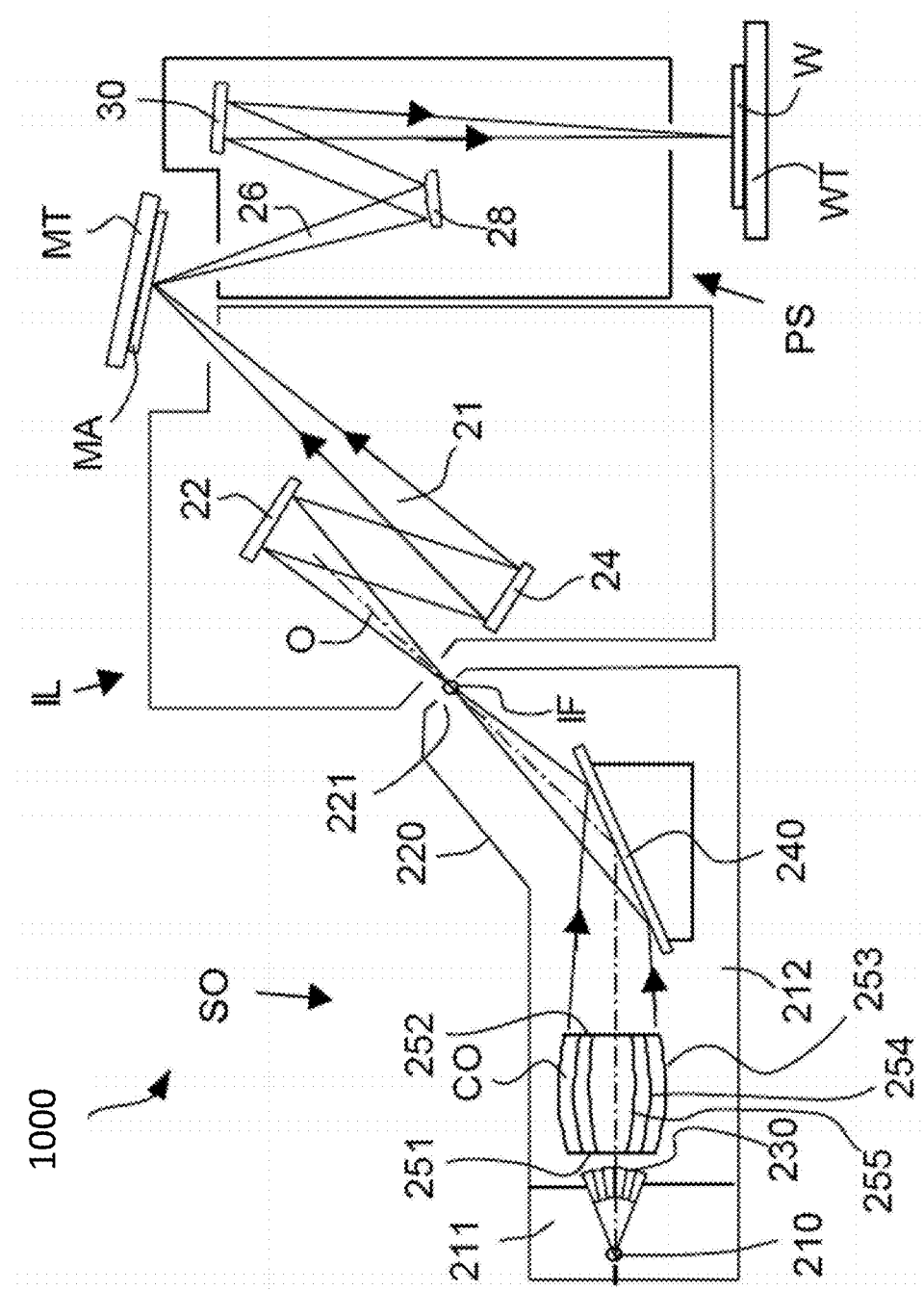
FIG. 14 is a more detailed view of the apparatus in FIG. 13.

FIG. 14 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 13.

Collector optic CO, as illustrated in FIG. 14, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 15:
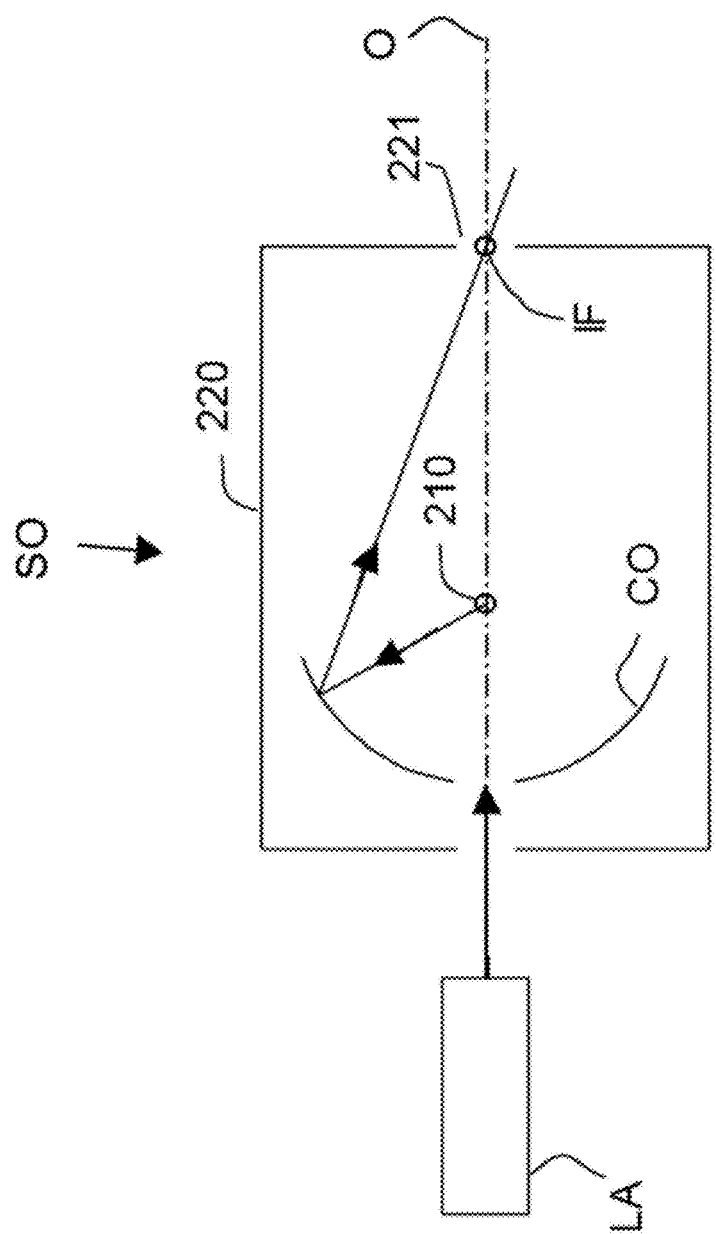
FIG. 15 is a more detailed view of the source collector module SO of the apparatus of FIGS. 13 and 14.

Alternatively, the source collector module SO may be part of an LPP radiation system as shown in FIG. 15. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

The methods disclosed here are also applicable to the pupil profile of the projection optics.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The invention may further be described using the following clauses:

1. A computer-implemented method for improving a lithographic process for imaging a portion of a design layout onto a substrate using a lithographic projection apparatus, the method comprising:
   providing a desired pupil profile;
   calculating a discrete pupil profile based on the desired pupil profile;
   selecting a discrete change to the discrete pupil profile; and
   applying the selected discrete change to the discrete pupil profile.
2. The method of clause 1, wherein the desired pupil profile is a pupil profile from an optimization or an empirical pupil profile.
3. The method of clause 1, wherein the discrete pupil profile is renderable by hardware of an illumination source of the lithographic projection apparatus.
4. The method of clause 1, wherein the discrete pupil profile comprises intensities at a plurality of spatially discrete positions on a pupil plane.
5. The method of clause 1, further comprising optimizing design variables unassociated to source hardware that generates discrete change in the discrete pupil profile.
6. The method of clause 1, further comprising iterating selecting a discrete change to the discrete pupil profile and applying the discrete change to the discrete pupil profile.
7. The method of clause 3, wherein the hardware of the illumination source comprises an array of mirrors.
8. The method of clause 1, wherein selecting a discrete change comprises calculating a plurality of gradients of a cost function, each of the plurality of gradients with respect to intensity at one of a plurality of spatially discrete positions on a pupil plane.
9. The method of clause 8, wherein the plurality of spatially discrete positions are positions at which intensity can change by adjusting hardware of an illumination source of the lithographic projection apparatus.
10. The method of clause 7, wherein at least one mirror in the array of mirrors has at least two discrete states.
11. The method of clause 10, wherein the at least one mirror changing from one of the at least two discrete states to another of the at least two discrete states generates a discrete change in intensity at one or more positions on a pupil plane.
12. The method of clause 1, wherein selecting a discrete change comprises selecting the discrete change from a plurality of discrete changes.

13. The method of clause 12, wherein at least one discrete change in the plurality of discrete changes is a discrete change in intensity at one or more of discrete positions of the discrete pupil profile.

14. The method of clause 12, wherein the plurality of discrete changes includes all possible discrete changes that changing only one, only two, only three, and/or only four mirrors in an array of mirrors in an illumination source from one state to another state generates.

15. The method of clause 12, wherein the plurality of discrete changes exclusively includes those discrete changes that maintain a total intensity in the discrete pupil profile.

16. The method of clause 12, wherein the plurality of discrete changes exclusively includes those discrete changes that decrease a fill ratio of the discrete pupil profile.

17. The method of clause 12, wherein selecting a discrete change further comprises calculating an estimated change in a value of a cost function for each of the plurality of discrete changes.

18. The method of clause 17, wherein calculating the estimated change comprises summing a product of a change in intensity at each of discrete positions of the discrete pupil profile in the plurality of discrete changes and gradients of a cost function at the discrete positions.

19. The method clause 17, wherein selecting a discrete change further comprises selecting the discrete change from the plurality of discrete changes based on the estimated change in a value of a cost function for each of the plurality of discrete changes.

20. The method of clause 19, wherein selecting the discrete change from the plurality of discrete changes comprises selecting one discrete change from the plurality of discrete changes that has a least or greatest estimated change among all of the plurality of discrete changes.

21. The method of clause 19, wherein selecting the discrete change from the plurality of discrete changes comprises selecting a subset from the plurality of discrete changes, wherein the estimated change of each in the subset is no greater than the estimated change of any one of the plurality of discrete changes that is not in the subset.

22. The method of clause 21, wherein selecting the discrete change from the plurality of discrete changes further comprises calculating actual change in value of the cost function for each of the discrete changes in the subset; and selecting one discrete change that generates a greater actual change in value of the cost function than any other in the subset generates.

23. The method of clause 1, wherein the desired pupil profile is a pupil profile from another lithographic projection apparatus.

24. The method of clause 12, wherein the plurality of discrete changes includes a discrete change having a symmetry about an optical axis of the lithographic projection apparatus.

25. The method of clause 12, wherein selecting a discrete change further comprises calculating a change in a value of a cost function for each of the plurality of discrete changes.

26. The method of clause 1, wherein the desired pupil profile is a pupil profile of an illumination source of the lithographic projection apparatus.

27. The method of clause 1, wherein the desired pupil profile is a pupil profile of projection optics of the lithographic projection apparatus.

28. The method of clause 8, wherein the cost function is a function of intensities at the plurality of spatially discrete positions on the pupil plane.

29. A computer program product comprising a computer readable medium having instructions recorded thereon, the instructions when executed by a computer implementing the method of any of the above clauses.

30. A computer-implemented method, wherein the method is implemented in a computer system comprising one or more processors configured to execute one or more computer program modules, the method comprising:
obtaining, on electronic storage media accessible to the one or more processors; executing, on the one or more processors of the computer system, one or more computer program modules configured to executing any one of the methods of clauses 1-27; and
displaying, on an electronic display communicatively linked with the one or more processors of the computer system, the discrete pupil profile.

The descriptions above are intended to be illustrative, not limiting. Thus, it will be apparent to one skilled in the art that modifications may be made as described without departing from the scope of the claims set out below.

What is claimed is:

1. A method comprising:
generating, by a hardware computer system, a discrete pupil profile based on a desired pupil profile designed for imaging a portion of a design layout onto a substrate using a lithographic projection apparatus;
selecting a discrete change, from among a plurality of different discrete changes, to the discrete pupil profile, wherein the selecting further comprises calculating an estimated change in a value of a cost function for each of the plurality of discrete changes;
applying, by the hardware computer system, the selected discrete change to the discrete pupil profile; and
generating electronic data, based on the discrete profile to which the selected discrete change has been applied, for use in configuring an optical component of, or for, the lithographic projection apparatus.

2. The method of claim 1, wherein the desired pupil profile is a pupil profile from an optimization or is an empirical pupil profile.

3. The method of claim 1, further comprising optimizing one or more design variables unassociated with lithographic projection apparatus illumination system hardware configured to generate a discrete change in the discrete pupil profile.

4. The method of claim 1, wherein selecting a discrete change comprises calculating a plurality of gradients of a cost function, each of the plurality of gradients being with respect to intensity at one of a plurality of spatially discrete positions on a pupil plane.

5. The method of claim 1, wherein the plurality of discrete changes includes a discrete change having a symmetry about an optical axis of the lithographic projection apparatus for lithographic projection apparatus illumination system hardware.

6. The method of claim 1, wherein at least one discrete change in the plurality of discrete changes is a discrete change in intensity at one or more discrete positions of the discrete pupil profile.

7. The method of claim 1, wherein the plurality of discrete changes exclusively include those discrete changes that maintain a total intensity in the discrete pupil profile.

8. The method of claim 1, wherein the plurality of discrete changes exclusively include those discrete changes that decrease a fill ratio of the discrete pupil profile.

9. A computer program product comprising a non-transitory computer readable medium having instructions recorded thereon, the instructions, when executed by a computer system, configured to at least:

generate a discrete pupil profile based on a desired pupil profile designed for imaging a portion of a design layout onto a substrate using a lithographic projection apparatus;

select a discrete change, from among a plurality of different discrete changes, to the discrete pupil profile, wherein the selection further comprises calculation of an estimated change in a value of a cost function for each of the plurality of discrete changes;

apply the selected discrete change to the discrete pupil profile; and generate electronic data, based on the discrete profile to which the selected discrete change has been applied, for use in configuring an optical component of, or for, a lithographic projection apparatus.

10. The computer program product of claim 9, wherein the desired pupil profile is a pupil profile from an optimization or is an empirical pupil profile.

11. The computer program product of claim 9, wherein the instructions are further configured to cause the computer system to calculate a plurality of gradients of a cost function, each of the plurality of gradients being with respect to intensity at one of a plurality of spatially discrete positions on a pupil plane.

12. The computer program product of claim 11, wherein the cost function is a function of intensities at the plurality of spatially discrete positions on the pupil plane.

13. The computer program product of claim 11, wherein the plurality of spatially discrete positions are positions at which intensity can change by adjusting illumination system hardware of the lithographic projection apparatus.

14. The computer program product of claim 9, wherein the plurality of discrete changes includes a discrete change having a symmetry about an optical axis of the lithographic projection apparatus for lithographic projection apparatus illumination system hardware.

15. The computer program product of claim 9, wherein at least one discrete change in the plurality of discrete changes is a discrete change in intensity at one or more discrete positions of the discrete pupil profile.

16. The computer program product of claim 9, wherein the plurality of discrete changes exclusively include those discrete changes that maintain a total intensity in the discrete pupil profile.

17. The computer program product of claim 9, wherein the plurality of discrete changes exclusively include those discrete changes that decrease a fill ratio of the discrete pupil profile.

18. A computer program product comprising a non-transitory computer readable medium having instructions recorded thereon, the instructions, when executed by a computer system, configured to at least:

generate a discrete pupil profile based on a desired pupil profile designed for imaging a portion of a design layout onto a substrate using a lithographic projection apparatus;

select a discrete change, from among a plurality of different discrete changes, to the discrete pupil profile, wherein the selection further comprises calculation of an estimated change in a value of a cost function for each of the plurality of discrete changes;

apply the selected discrete change to the discrete pupil profile; and display, on an electronic display communicatively linked with the computer system, the discrete pupil profile to which the selected discrete change has been applied.

19. The computer program product of claim 18, wherein the desired pupil profile is a pupil profile from an optimization or is an empirical pupil profile.

20. The computer program product of claim 18, wherein the instructions are further configured to cause the computer system to calculate a plurality of gradients of a cost function, each of the plurality of gradients being with respect to intensity at one of a plurality of spatially discrete positions on a pupil plane.

* * * * *